(12) United States Patent
Chiu et al.

(10) Patent No.: US 7,774,689 B2
(45) Date of Patent: Aug. 10, 2010

(54) ENCODING AND DECODING METHODS AND SYSTEMS

(75) Inventors: Mao-Ching Chiu, Hsinchu (TW); Hsiao-Feng Lu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1037 days.

(21) Appl. No.: 11/489,474

(22) Filed: Jul. 20, 2006

(65) Prior Publication Data

US 2007/0226598 A1    Sep. 27, 2007

Related U.S. Application Data

(60) Provisional application No. 60/783,052, filed on Mar. 17, 2006.

(51) Int. Cl.
*H03M 13/03* (2006.01)
(52) U.S. Cl. .................................... 714/786; 714/752
(58) Field of Classification Search ................ 714/752, 714/786
See application file for complete search history.

(56) References Cited

U.S. PATENT DOCUMENTS

2006/0294445 A1 * 12/2006 Divsalar et al. ............. 714/752

OTHER PUBLICATIONS

European Search Report for counterpart European Application No. 06255791.

Li et al, "On the Performance of High-Rate TPC/SPC Codes and LDPC Codes Over Partial Response Channels," IEEE Transactions on Communications, pp. 723-734, vol. 50, No. 5, May 2002.

Benedetto et al., "Unveiling Turbo Codes: Some Results on parallel Concatenated Coding Schemes," IEEE Transactions of Information Theory, pp. 409-428, vol. 42, No. 2, Mar. 1996.

Divsalar et al., "Coding Theorems for "Turbo-Like" Codes," Proc. 1998, Allerton Conf. Commun. and Control, pp. 1-10, Sep. 1998.

Jin et al., "Irregular Repeat-Accumulate Codes," Prod. $2^{nd}$ International Symposium on Turbo Codes and Related Topics, Sep. 2000.

Benedetto et al., "Serial Concatenation of Interleaved Codes: Performance Analysis, Design, and Iterative Decoding," IEEE Transactions on Information Theory, pp. 909-926, vol. 44, No. 3, May 1998.

Lucas et al., "Iterative Decoding of One-Step Majority Logic Decodable Codes Based on Belief Propagation," IEEE Transactions on Communications, pp. 931-937, vol. 48, No. 6, Jun. 2000.

Chung et al., "On the Design of Low-Density Parity-Check Codes within 0.0045 dB of the Shannon Limit," IEEE Communications Letters, pp. 58-60, vol. 5, No. 2, Feb. 2001.

(Continued)

*Primary Examiner*—Sam Rizk
(74) *Attorney, Agent, or Firm*—Finnegan, Henderson, Farabow, Garrett & Dunner, L.L.P.

(57) ABSTRACT

An encoder for use in information processing applications includes an input configured to provide information bits to be encoded and a feedforward convolutional outer code encoder configured to encode the information bits to generate encoded information bits including the information bits and parity bits. The encoder may also include at least one interleaver configured to interleave the encoded information bits to generate an outer codeword. Further, the encoder may include a rate-1 1/(1+D) accumulate code based inner code encoder configured to encode the outer codeword to generate one or more codewords corresponding to the information bits.

17 Claims, 8 Drawing Sheets

OTHER PUBLICATIONS

Nefedov, "Comparison of Low Complexity Turbo-Like Coding Structures," Proc. 2001 IEEE International Conference on Communications, pp. 50-54, vol. 1, Jun. 2001.

Nefedov, "Performance of Low Complexity Accumulated Convolutional Codes," Proc. International Symposium on Turbo Codes and Related Topics, pp. 419-422, Sep. 2000.

Huebner et al., "On the Design of Woven Convolutional Encoders with Outer Warp Row Permutors," IEEE Transactions on Communications, pp. 438-444, vol. 54, No. 3, Mar. 2006.

Narayanan et al., "A Serial Concatenation Approach to Iterative Demodulation and Decoding," IEEE Transactions on Communication, pp. 956-961, vol. 47, No. 7, Jul. 1999.

Li et al., "Product Accumulate Codes: A Class of Codes with Near-Capacity Performance and Low Decoding Complexity," IEEE Transactions on Information Theory, pp. 31-46, vol. 50, No. 1, Jan. 2004.

Peleg et al., "On Interleaved, Differentially Encoded Convolutional Codes," IEEE Transactions on Information Theory, pp. 2572-2582, vol. 45, No. 7, Nov. 1999.

Host, "Woven Convolutional Codes," Internet Citation, XP002181075, www.it.lth.se/stefanh/Thesis/Thesis.pdf, Sep. 1999.

* cited by examiner

ENCODING AND DECODING METHODS AND SYSTEMS

RELATED APPLICATIONS

This application claims the benefit of U.S. Provisional Application No. 60/783,052, filed Mar. 17, 2006, the contents of which are incorporated in their entirety herein by reference.

TECHNICAL FIELD

The present invention generally relates to the field of channel coding techniques and, more particularly, to methods and systems using accumulate codes based coding and decoding algorithms.

BACKGROUND

Turbo codes and low-density parity-check (LDPC) codes have gained increasing acceptance as error correction coding standards for communication systems, especially for wireless mobile communication systems. Both the turbo codes and the LDPC codes may be used to achieve near-capacity performance that may be desirable for use in communication channels with unavoidable noise or interference.

A turbo code may generally include two or more convolutional codes. A turbo code may be constructed by a turbo encoder having two conventional convolutional code encoders and several interleavers. The turbo code encoded information may be decoded by using an iterative decoding technique with a computational complexity that is comparable to what is needed for each convolutional code. However, decoding each convolutional code iteratively may cause delays and thus may increase latency of the underlying communication systems.

Unlike a turbo code, a LDPC code does not have a definite structure in general and may be specified by a sparse parity-check matrix, that is, a matrix with a relatively small number of ones. The LDPC code may also be regarded as a combination of multiple single-parity check (SPC) codes corresponding to rows of the sparse parity-check matrix. Accordingly, a LDPC decoder may be a combination of numerous relatively simple sub-decoders, one for each SPC code. The decoding process may be carried out by iteratively exchanging information between the sub-decoders, whose task includes providing information regarding each SPC code. For example, the decoding process may be performed by using a belief propagation (BP) algorithm, a sum-product algorithm (SPA), or a min-sum algorithm. However, the LDPC code is often designed based on a computer-generated pseudo-random parity-check matrix and thus does not possess a simple encoding structure. In certain circumstances, it may be impractical to use the LDPC in certain communication systems because of the complexity associated with the LDPC encoding structures.

Technologies have been developed to improve performance of turbo codes and LDPC codes. For example, Li et al., "*Product accumulate codes: a class of codes with near-capacity performance and low decoding complexity*," IEEE Trans. Inform. Theory, vol. 50, pp. 31-46 (January, 2004), proposes product accumulate (PA) codes that are constructed based on a serial concatenation of an outer codeword that is a turbo-product or direct-product of SPC codes and an inner codeword of a convolutional code. Although such technologies reduce some computational complexity of the encoding and decoding processing, the computational load may still be high and thus may be undesirable for certain applications such as high speed wireless communication and/or high density storage applications. Also, the size of memory entries of interleavers for such technologies may be equal to the length of the information bits to be encoded, which may require a large amount of memory to be used during the encoding process. Such memory requirement may be impractical or undesirable in certain circumstances such as in portable communication devices.

Methods and systems consistent with certain features of the disclosed embodiments are directed to solving one or more of the problems set forth above.

SUMMARY OF THE INVENTION

One aspect of the present disclosure includes an encoder for use in information processing applications. The encoder may include an input configured to provide information bits to be encoded and a feedforward convolutional outer code encoder configured to encode the information bits to generate encoded bits including the information bits and parity bits. The encoder may also include at least one interleaver configured to interleave the encoded information bits to generate an outer codeword, and a rate-1 1/(1+D) accumulate code based inner code encoder configured to encode the outer codeword to generate one or more codewords corresponding to the information bits.

Another aspect of the present disclosure includes a decoder for use in information processing applications. The decoder may include an input configured to provide received information to be decoded and an inner decoder configured to decode inner codewords encoded by a rate-1 1/(1+D) accumulate code based inner code encoder to generate a log-likelihood ratio. The decoder may also include an outer decoder configured to decode outer codewords encoded by a feedforward convolutional outer codeword to generate extrinsic information and an interleaver configured to interleave the extrinsic information from the outer decoder to the inner decoder. Further, the decoder may include a de-interleaver configured to de-interleave the log-likelihood ratio from the inner decoder to the outer decoder.

Another aspect of the present disclosure includes a method for encoding information bits in information processing applications. The method may include obtaining the information bits to be encoded and encoding the information bits using a feedforward convolutional outer code encoder to generate encoded information bits including the information bits and parity bits. The method may also include interleaving the encoded information bits to generate an outer codeword by using at least one interleaver and encoding the outer codeword by using a rate-1 1/(1+D) accumulate code based inner code encoder to generate one or more codewords corresponding to the information bits.

DETAILED DESCRIPTION

Reference will now be made in detail to exemplary embodiments, which are illustrated in the accompanying drawings. Wherever possible, the same reference numbers will be used throughout the drawings to refer to the same or like parts.

Figure 1:
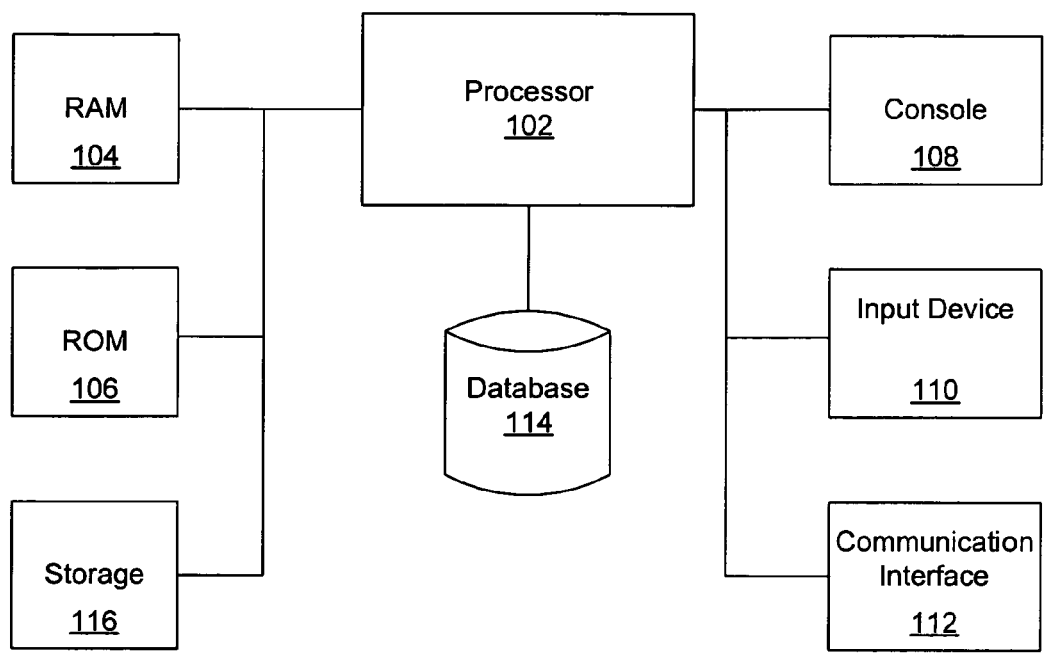
FIG. 1 illustrates an exemplary information system 100 that incorporates certain embodiments consistent with the present invention.

FIG. 1 shows an exemplary information system 100 that incorporates certain embodiments consistent with the present invention. Information system 100 may include any appropriate type of information processing system, such as a computer system, communication equipment, a data storage system, and/or a wireless communication device. Information system 100 may process encoded information and may involve encoding and/or decoding of certain information.

As shown in FIG. 1, information system 100 may include a processor 102, a random access memory (RAM) 104, a read-only memory (ROM) 106, a console 108, an input device 110, a communication interface 112, a database 114, and a storage 116. It is understood that the type and number of listed devices are exemplary only and not intended to be limiting. The number of listed devices may be changed, certain devices may be removed, and other devices may be added.

Processor 102 may include any appropriate type of general purpose microprocessor, digital signal processor, application specific integrated circuit (ASIC), or microcontroller. Processor 102 may execute sequences of computer program instructions to perform various information processing functions including certain encoding and/or decoding functions. Processor 102 may be coupled to or access other devices, such as RAM 104, ROM 106, console 108, input device 110, communication interface 112, database 114, and/or storage 116, to complete execution of computer program instructions.

The computer program instructions may be loaded into RAM 104 from read-only memory (ROM) 106 for execution by processor 102, or from storage 116. Storage 116 may include any appropriate type of mass storage provided to store any type of information that processor 102 may need to perform processing/functions. For example, storage 116 may include one or more hard disk devices, optical disk devices, floppy disk devices, and/or other storage devices to provide storage space.

Console 108 may provide a graphic user interface (GUI) or other user interfaces to display information to a user or users of information system 100. Console 108 may include any appropriate type of information display device or computer monitor. Input device 110 may be provided for the user or users to input information into information system 100. Input device 110 may include a keypad, a keyboard, a mouse, or other optical or wireless input device, etc.

Database 114 may contain any information used by processor 102. Database 114 may include any type of commercial or customized database. Database 114 may also include analysis tools for analyzing the information in the database.

Communication interface 112 may provide communication connections to enable information system 100 to exchange information with other communication systems, and/or may also provide network connections for information system 100 to be accessed remotely through computer networks, such as the Internet.

Figure 2:
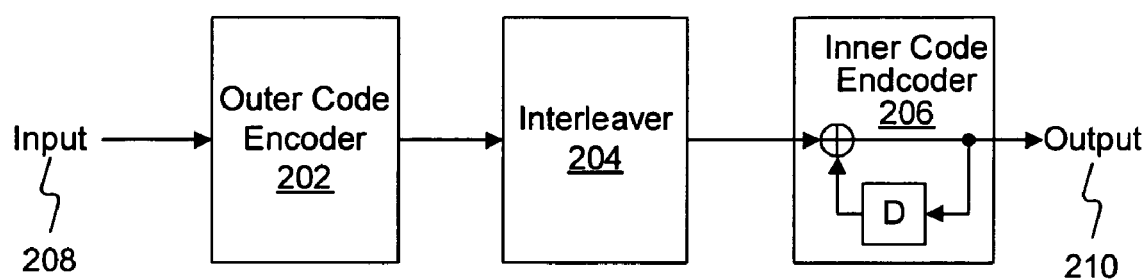
FIG. 2 illustrates a block diagram of an exemplary encoder consistent with the present invention.

Communication interface 112 may include any appropriate device to provide one or more communication channels, such a wireless communication channel, a wired communication channel, and/or an optical communication channel. The communication channels may require the information exchanged through the communication channels to be encoded to improve the quality of the information, such as a reduced bit error rate (BER), etc. Therefore, communication interface 112 and/or processor 102 may provide an encoder and/or a decoder implementing certain encoding and/or decoding functions for the information exchanged through the communication channels. FIG. 2 shows a block diagram of an exemplary encoder consistent with the present invention.

As shown in FIG. 2, encoder 200 may include an outer code encoder 202, an interleaver 204, and an inner code encoder 206. An input 208 may include any type of information data, such as information bit streams or data sequences, etc. Input 208 may be provided to encoder 200 and, more particularly, to outer code encoder 202 such that the data of input 208 may be encoded. The encoded information data may be referred to as a code, which may further include a set of codewords. A codeword may refer to a part of the encoded information or a unit of encoded information generated by an encoding device or devices. A data sequence encoded by outer code encoder 202 may be interleaved by interleaver 204. The interleaved encoded data sequence may be referred to as an outer codeword, and the outer codeword may be further encoded by inner code encoder 206 to create an inner codeword. The inner codeword may then be processed and/or provided as output 210. Output 210 may be referred to as the encoded data sequence and may be further processed or transmitted through the communication channels.

Outer code encoder 202 may include any appropriate type of encoder, such as a block encoder or a convolutional encoder. In certain embodiments, outer code encoder 202 may include a feedforward convolutional encoder with form (1+D), where D may be referred to as a unit of delay. As used herein, a feedforward code refers to a code generated by feedforward register banks, and a convolutional code refers to a code constructed through use of current data bits plus some of the previous data bits from an information bit stream to be encoded. Other types of encoders may also be used.

Interleaver 204 may include one or more appropriate interleavers, such as a random interleaver, a block interleaver, a diagonal interleaver, and/or a circular-shifting interleaver, etc., for interleaving a data sequence, e.g., rearranging the order of a data sequence in an one-to-one deterministic format. Interleaver 204 interleaves the information data sequence encoded by outer code encoder 202 before the information data sequence is further encoded by inner code encoder 206. The interleaved data sequence, e.g., the outer codeword, between the two encoders may increase decorrelation among various data blocks of the data sequence provided by outer code encoder 202. In certain circumstances, interleaver 204 may be treated as being included in outer code encoder 202.

Further, inner code encoder 206 may also include any appropriate type of encoder such as a block encoder or a convolutional encoder. In certain embodiments, inner code encoder 206 includes a rate-1 recursive convolutional inner code encoder of form 1/(1+D). Other types of encoders, however, may also be used. Further, outer code encoder 202, interleaver 204, and inner code encoder 206 or encoder 200 may be implemented by hardware, computer software, or a combination of hardware and computer software. As used herein, a code rate of an encoder, e.g., outer code encoder 202, inner code encoder 206, etc., refers to the ratio of the number of input bits to the number of output bits. For example, an inner encoder with a rate-1 may indicated that the number of input bits equals to the number of output bits. Further, the code rate of a concatenated coding system, e.g., encoder 200, equals to a product of code rates of the inner code and the outer code.

Figure 3:
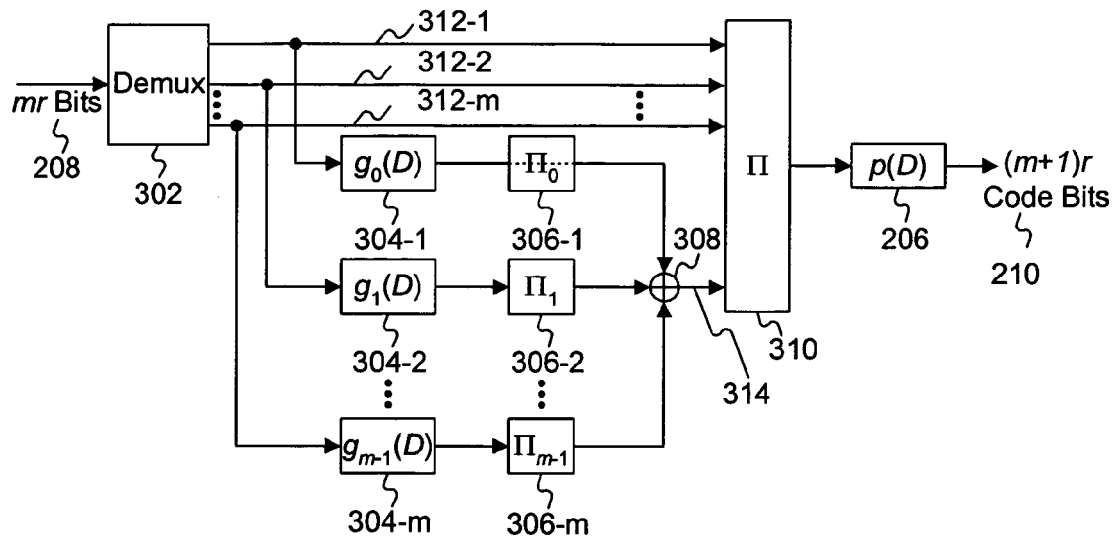
FIG. 3 illustrates an exemplary configuration of an encoder consistent with the present invention.

An exemplary configuration of encoder 200, e.g., outer code encoder 202, interleaver 204, and inner code encoder 206, etc., is illustrated in FIG. 3. As shown in FIG. 3, input 208 may include information bits with a size of k=mr (k, m, r, are integers). A de-multiplexer 302 may be provided to de-multiplex the information bits into m blocks, each having r information bits. Outer code encoder 202 may include low weight generator polynomials 304-1, 304-2, ..., and 304-m, each individually denoted as $g_i(D)$ for i=0, ..., m−1, respectively. Each generator polynomial $g_i(D)$ is referred to herein as an encoding branch, and each encoding branch is coupled to a corresponding interleaver 306-1, 306-2, ..., and 306-m, respectively. Further, outer code encoder 202 may be represented by a systematic generator matrix $[1, g_i(D)]$, for i=0, ..., m−1.

Each block of size r may be independently encoded by the corresponding generator polynomial, e.g., corresponding encoding branch, and may also be simultaneously passed through as systematic outputs 312-1, 312-2, ..., and 312-m, e.g., the m blocks of information bits. As used herein, a systematic output refers to original information bits, such as a de-multiplexed original block of r information bits.

Further, interleaver 204 includes interleavers 306-1, 306-2, ..., and 306-m, each individually denoted as $\Pi_i$ for i=0, ..., m−1, respectively, for interleaving respective output from generator polynomials 304-1, 304-2, ..., and 304-m. As a practical matter, $\Pi_0$ may be omitted without adverse impact. Also, interleaver 204 may further include interleaver 310, denoted as $\Pi$, to be coupled to inner code decoder 206 to interleave the outer codeword before the outer codeword is encoded by inner code encoder 206. Outputs from interleavers 306-1, 306-2, ..., and 306-m are summed by an adder 308 to create parity bits 314 of size r. As used herein, parity bits 314 refer to redundancy information bits used for error detection and/or error correction of information transmitted over communication channels. Adder 308 may use any appropriate type of addition, such as a modulo-2 addition, etc., to sum up the outputs from the interleavers.

Parity bits 314 are concatenated with systematic outputs 312-1, 312-2, ..., 312-m to form a sequence of (m+1)r bits including the original mr information bits and r parity bits. The sequence of (m+1)r bits may be further interleaved by interleaver 310. The interleaved sequence of (m+1)r bits are then encoded by inner code encoder 206, e.g., a rate-1 convolutional encoder with generator polynomial p(D), to create output 210.

A codeword (e.g., output 210) generated by encoder 200 (or encoder 206) may be denoted as a (n, k)=((m+1)r, mr) linear code, where (n, k) refers to a linear code accepting a block of k information bits and producing a block of n coded information bits (with n−k redundant bits added to the k information bits). The rate of the code generated by encoder 200 is calculated as:

$$R = mr/(m+1)r = m/(m+1), \text{ for } m \geq 1.$$

Further, when m≥1, R=m/(m+1)≥½, the configuration of encoder 200 shown in FIG. 3 may be used to generate high rate codes, i.e., rate R≥½.

Figure 4:
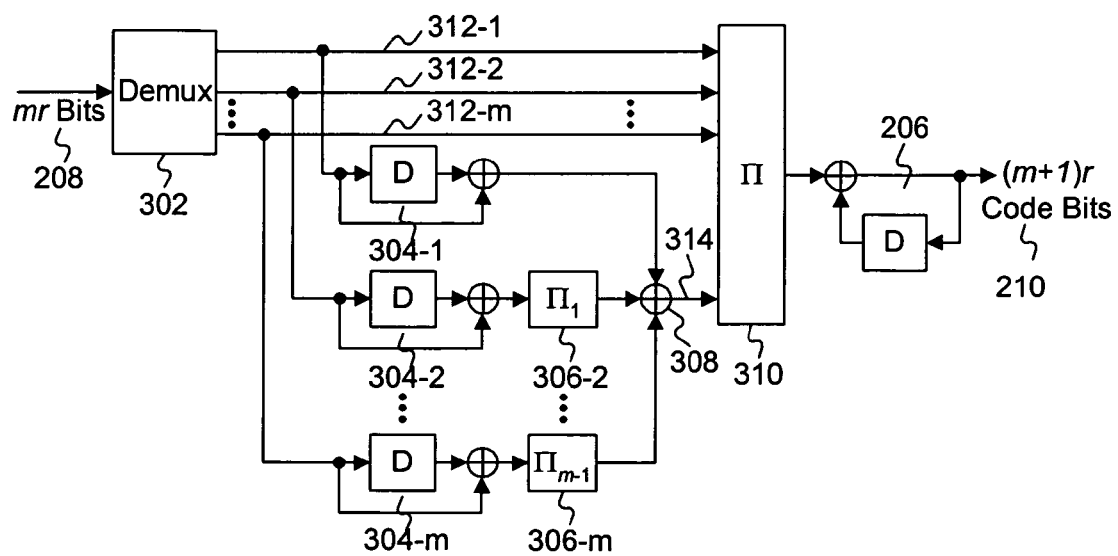
FIG. 4 illustrates another exemplary configuration of an encoder consistent with the present invention.

FIG. 4 shows another exemplary configuration of encoder 200. In certain embodiments, as shown in FIG. 4, generator polynomials 304-1, 304-2, ..., and 304-m may be chosen to be equal as 1+D, i.e., $g_i(D)=1+D$ for i=0, ..., m−1, and generator polynomial p(D) may be chosen to be 1/(1+D). Codes, e.g., output 210, generated by this configuration are referred to herein as single-feedforward-register convolutional accumulate (SFRCA) codes. That is, the implementation of outer codewords of form (1+D) is implemented by a single feed-forward register and the resulting codes are convolutional accumulate codes.

Further, the generator matrix of the outer codeword may be mathematically represented as:

$$G = \begin{bmatrix} I_r & 0 & \cdots & 0 & G_{1+D} \\ 0 & I_r & \cdots & 0 & G_{1+D}\Pi_1 \\ \vdots & \vdots & \ddots & \vdots & \vdots \\ 0 & 0 & \cdots & I_r & G_{1+D}\Pi_{m-1} \end{bmatrix} \quad (1)$$

where $\Pi_0$ is omitted; $I_r$ denotes a r×r identity matrix, $\Pi_i$, for i=1, ..., m−1 are interleavers such as row permutation matrices, and $G_{1+D}$ represents a r×r binary generator matrix which is equivalent to the convolutional encoder with generator 1+D truncated to length r. Generator matrix $G_{1+D}$ may be mathematically represented as:

$$G_{1+D} = \begin{bmatrix} 1 & 1 & 0 & \cdots & 0 \\ 0 & 1 & 1 & \cdots & 0 \\ \vdots & \vdots & \vdots & \ddots & \vdots \\ 0 & 0 & 0 & \cdots & 1 \end{bmatrix} \quad (2)$$

Further, a parity-check matrix of the outer codeword may be derived from equation (1) as:

$$H = [G_{1+D}^T \quad \Pi_1^T G_{1+D}^T \quad \cdots \quad \Pi_{m-1}^T G_{1+D}^T \quad I_r] \quad (3)$$

It may be observed from (2) and (3) that the number of 1's in H is small, that is, parity-check matrix H possesses a low density of 1's. The column weights, i.e., the total number of 1's in a column, of H are at most 2m+1 and the row weights, i.e., the total number of 1's in a row, are at most 2. It may also be observed from (3) that a minimum Hamming distance of the outer codeword is 2. For example, for m=1, there is exactly one codeword, i.e., an encoded data sequence of a predefined length including parity bits, of weight-2 as observed from the structure of parity-check matrix H. The last weight-1 column of $G_{1+D}^T$ and the last weight-1 column of identity matrix $I_r$ are identical, meaning the minimum Hamming distance of the outer codeword is 2.

Although the minimum Hamming distance of the outer codeword is 2, the average number of weight-2 outer codewords may be only a function of a single parameter m when the code length n is large. In certain embodiments, interleavers $\Pi_i$, for i=1, ..., m−1, may be uniform interleavers and may also be probabilistic devices and independent of each other. From the parity-check matrix (3), it may be observed that the average number of weight-2 outer codewords is equal to the average number of pairs of identical columns in H. Provided that $A_h^{C_o}$ is the number of outer codewords of Hamming weight 2 and r is large (i.e. as the code length n=(m+1)r is large), the number of weight-2 outer codewords is derived as:

$$A_2^{C_o} = (r-1)^2 \frac{\binom{m}{2}}{\binom{r}{2}} + m + \frac{\binom{m}{2}}{\binom{r}{1}} \quad (4)$$

$$= \frac{m(m-1)(r-1)}{r} + m + \frac{m(m-1)}{2r}$$

$$= O(m^2),$$

Therefore, the number of weight-2 outer codewords depends only on the parameter m, which is related only to the rate of the constructed code and not to the block length r. Further, the weight-2 outer codewords are completely eliminated as described below.

When the initial state of each (1+D) encoder is set to the value of the last information bit in each block, the bit tailing trellis of the (1+D) encoder in the initial state and that in the final state of the (1+D) encoder become identical. The $G_{1+D}$ binary matrix becomes a circulant matrix with [1, 1, 0, ..., 0] being the first row. Further, if m=2, there will be no weight-2 codeword. Even if m>2, as long as mr<$\binom{r}{2}$ which is often the case, it may possible to design interleavers $\Pi_{i_1}, \ldots, \Pi_{m-1}$, so that any two columns of equation (3) are distinct from each other to construct efficient codes for error corrections.

Figure 5:
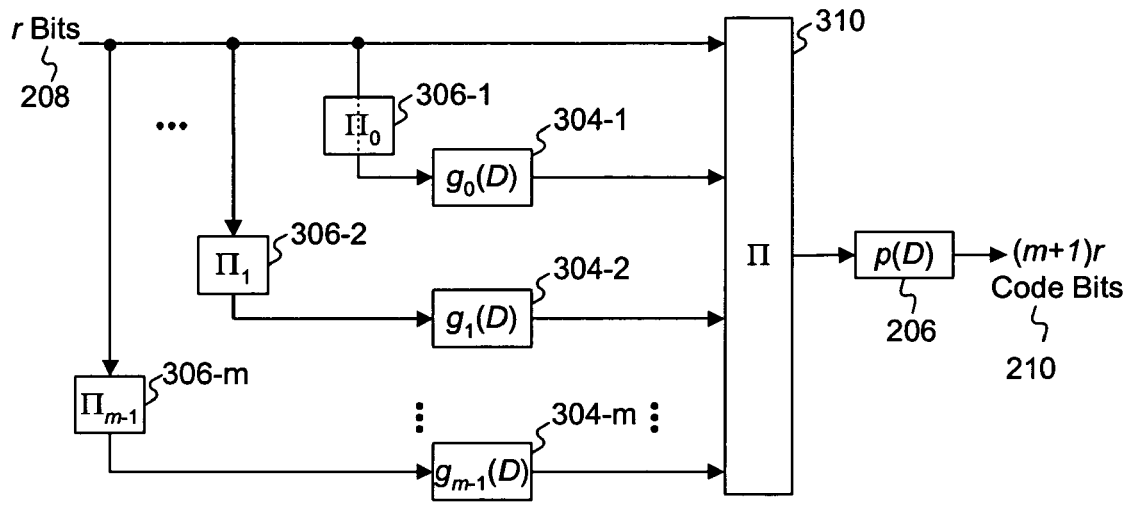
FIG. 5 illustrates another exemplary configuration of an encoder consistent with the present invention.

In certain embodiments, encoder 200 may also be configured to perform low rate encoding to generate low rate codes with rate R≦½. FIG. 5 shows another exemplary configuration encoder 200 for low rate codes. As shown in FIG. 5, input 208 may include r information bits instead of mr information bits. The r information bits, i.e., input 208, may be duplicated m times and each duplicated r information bits may be interleaved by interleavers $\Pi_i$, for i=0, ..., m−1, i.e., interleavers 306-1, 306-2, ..., and 306-m. Interleavers 306-1, 306-2, ..., and 306-m are coupled between each corresponding branch encoder 304-1, 304-2, ..., and 304-m, respectively, and input 208. In practice, however, $\Pi_0$ may be omitted without any adverse impact. The interleaved bits from interleavers 306-1, 306-2, ..., and 306-m are encoded by corresponding convolutional code with generator polynomials 304-1, 304-2, ..., and 304-m, e.g., $g_i(D)$, for i=0, ..., m−1, to create a total encoded bits of size mr bits.

The total encoded mr information bits and the un-encoded r information bits have a size of (m+1)r bits. Further, the (m+1)r information bits from the outer code encoder 202 are further interleaved by interleaver 310 (i.e., $\Pi$) and the interleaved (m+1)r information bits are then encoded by inner code encoder 206, e.g., a rate-1 convolutional encoder with generator p(D), to generate output 210 of a size of (m+1)r information bits. Therefore, the constructed code has a rate of R=r/(m+1)r=1/(m+1). Because m≧1 and thus R≦½, the configuration of encoder 200 shown in FIG. 5 may be used to generate low rate codes (i.e., codes with rate R≦½).

Figure 6:
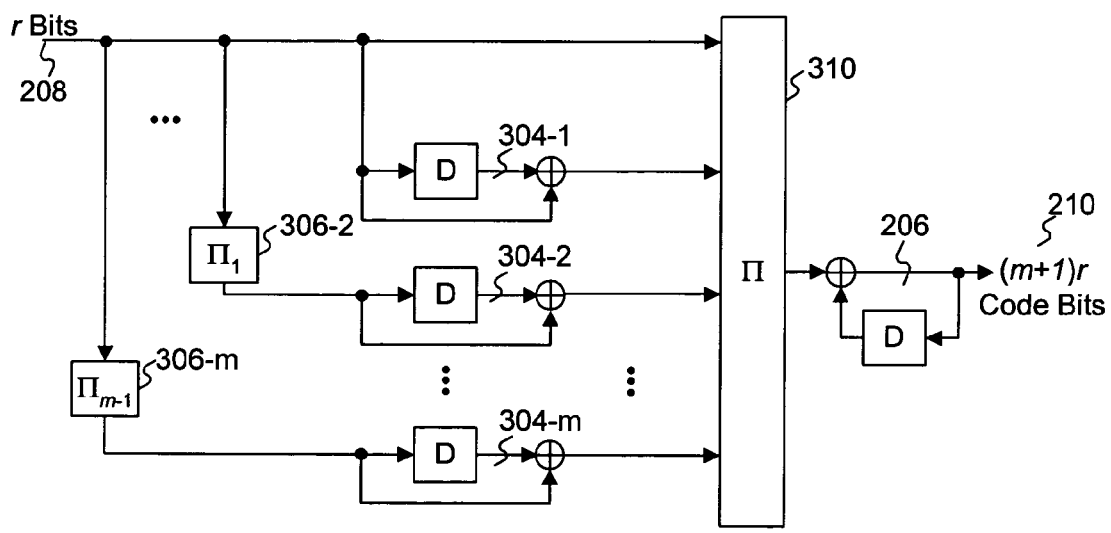
FIG. 6 illustrates another exemplary configuration of an encoder consistent with the present invention.

FIG. 6 shows another exemplary configuration of encoder 200 for low rate codes. In certain embodiments such as shown in FIG. 6, similar to a high rate encoder configuration, such as shown in FIG. 4, generator polynomials 304-1, 304-2, ..., and 304-m may be chosen to be the same as 1+D, i.e., $g_i(D)$= 1+D for i=0, ..., m−1, and generator polynomial p(D) may be chosen to be 1/(1+D) to generate SFRCA codes. The generator matrix can be mathematically represented as:

$$G_{low} = [I_r\ G_{1+D}\ \Pi_1 G_{1+D} \ldots \Pi_{m-1} G_{1+D}] \quad (5)$$

Comparing equation (3) with equation (5), it may be observed that the low-rate outer codeword is the dual code of the high-rate outer codeword, with certain permutations of some information bits and code bits. In one embodiment for high rate codes, m may be set to 1 such that no interleaver is required in outer code encoder 202. In another embodiment for high rate codes, each parity bit from each (1+D) encoder, i.e., $g_i(D)$, may be directly added to the memory content of interleaver 310 such that interleavers 306-1, 306-2, ..., and 306-m may be eliminated completely.

Figure 7:
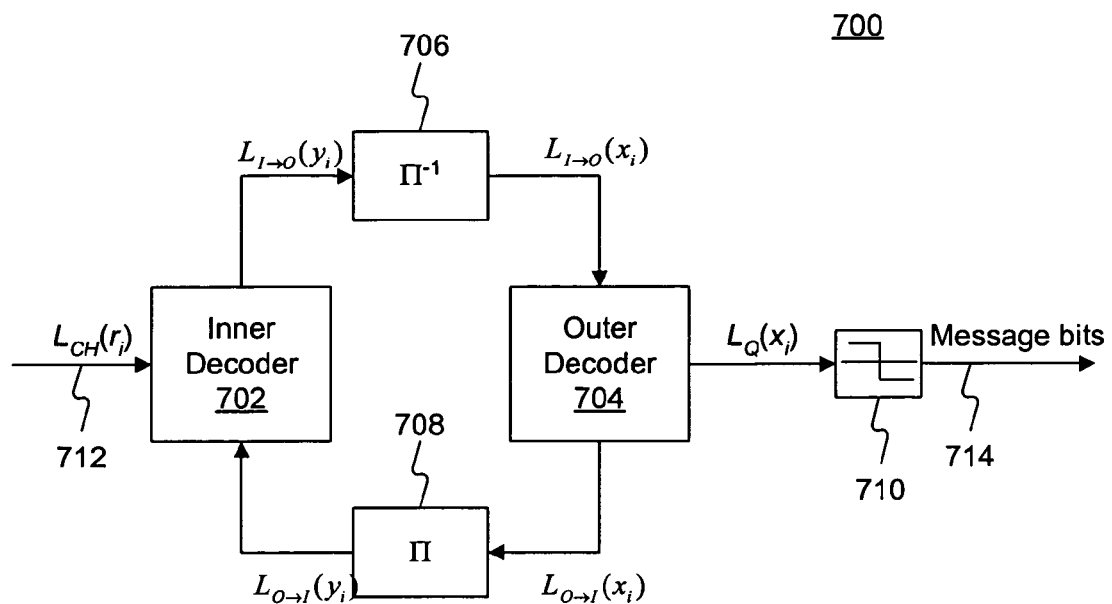
FIG. 7 illustrates a block diagram of an exemplary decoder consistent with the present invention.

Further, output 210, e.g., information bits encoded by encoder 200, may be further transmitted through communication interface 112 to other communication systems. Communication interface 112 and/or processor 102 may also receive information that was originally encoded by encoder 200 from other communication systems. Communication interface 112 and/or processor 102 may also provide one or more decoders to decode the received encoded information bits. FIG. 7 shows a block diagram of an exemplary decoder 700.

As shown in FIG. 7, decoder 700 includes an inner decoder 702, an outer decoder 704, a de-interleaver 706, an interleaver 708, and a decision device 710. Decoder 700 may be implemented as any appropriate type of iterative decoding algorithms, such as belief propagation (BP) algorithms, etc. Decoder 700 may also be used to perform hard decision decoding, for example, to determine message bits from received information bits.

Inner decoder 702 may include any appropriate type of decoder for decoding information encoded by inner code encoder 206. For example, inner decoder 702 may include a decoder or decoders based on a 2-state BCJR algorithm, such as one described in L. R. Bahl et al., *Optimal Decoding of Linear Codes for Minimizing Symbol Error Rate*, IEEE Trans. Inform. Theory, vol. 20, pp. 284-278, 1974. Further, outer decoder 702 may include any appropriate type of decoder for decoding information encoded by outer coder encoder 202. For example, outer decoder 702 may include a decoder or decoders based on a message passing algorithm.

In certain embodiments, received information 712 is provided to decoder 700 for decoding. Received information 712 may be related to an original message encoded by a particular encoder such as encoder 200. Received information 712 may also be originally modulated based on a particular modulation mechanism and may be transmitted from a communication channel with particular characteristics. For example, received information 712 may be originally modulated with a binary phase shift keying (BPSK) modulation and may be transmitted through an additive white Gaussian noise (AWGN) channel. Other channels (e.g., FIR filter channel, etc.) or modulation mechanisms, however, may also be used.

Received information 712 may be mathematically represented based on the original message bits, encoder 200, e.g., outer code encoder 202, inner code encoder 206, etc., modulation mechanism, and/or channel characteristics. For example, $x=[x_1, x_2, \ldots, x_n]$ may be used to represent a codeword from outer code encoder 202. The first k bits of x represent the message bits and the last n−k bits are parity bits or parity check bits, e.g., redundancies.

Further, $y=[y_1, y_2, \ldots, y_n]$ may be the interleaved coded bits of x interleaved by interleaver 204 (i.e., y=$\Pi$x). Interleaved coded bits y may be encoded by inner code encoder 206, e.g., rate-1 1/(1+D) convolutional encoder, to create encoded bits $z=[z_1, \ldots, z_n]$, where $z_i=z_{i-1}+y_i$, for i=1, ..., n with an initial condition $z_0=0$. In the example using the BPSK modulation via the AWGN channel, the signal after BPSK modulator may be represented as:

$$s_i = 2z_i - 1$$

A channel output may be represented as:

$$r_i = s_i + \eta_i,$$

where $n_i$ is the zero-mean white Gaussian noise with variance $\sigma_n^2$.

Received information 712 may then be represented by $L_{CH}$ ($r_i$), where L refers to extrinsic information. Codewords x may be structurally represented by a graph. Extrinsic information may refer to the log-likelihood ratio (LLR) for a given bit in a received codeword based on the log-likelihood ratios of all the other bits in the codeword (excluding the given bit) and the known structure of the codeword in the representative graph. The log-likelihood ratio of the given bit may be referred to as intrinsic information.

$L_{CH}$($r_i$) is decoded by inner decoder 702 and outer decoder 704 using, for example, a recursive decoding algorithm. The decoding process for decoding codewords x may be to find a codeword with the smallest global cost by exploiting the graph structures. At any iteration, for example, the qth iteration, inner decoder 702, e.g., decoder for 1/(1+D) accumulate code, may compute extrinsic information of $y_i$ based on the received log-likelihood ratio (LLR) $r_i$ and extrinsic information from the outer decoder $L_{O \rightarrow I}^{q-1}(y_i)$ at previous iteration by:

$$L_{I \rightarrow O}^q(y_i) = g(\{L_{CH}(y_i)\}_{i=1}^n, \{L_{O \rightarrow I}^{q-1}(y_i)\}_{i=1}^n),$$

Where subscript I→O denotes the quantity passed from inner decoder 702 to outer decoder 704; subscript O→I denotes the quantity passed from outer decoder 704 to inner decoder 702; g(•, •) denotes the decoding function of inner decoder 702; and $L_{CH}(y_i)$ denotes the LLR obtained from a channel with $$L_{CH}(y_i) = \log \frac{p(r_i | y_i = 0)}{p(r_i | y_i = 1)}.$$

Further, $L_{CH}(y_i)$ may also be represented as $L_{CH}(y_i) = -2r_i / \sigma_n^2$ for the AWGN channel. The LLRs $\{L_{I \rightarrow O}^q(y_i)\}_{i=1}^n$ may be de-interleaved by de-interleaver 706 to generate LLRs $\{L_{I \rightarrow O}^q(x_i)\}_{i=1}^n$. A de-interleaver generally performs reverse operations of an interleaver.

At the same time, outer decoder 704 may, based on the LLRs $\{L_{I \rightarrow O}^{q-1}(x_i)\}_{i=1}^n$, perform a BP algorithm over the graph of the outer codeword and may output the extrinsic information $L_{O \rightarrow I}^q(x_i) = h(L_{I \rightarrow O}^{q-1}(x_i))$, where h(•) denotes the decoding function of outer decoder 704, which may be implemented using the BP algorithm over the bipartite graph specified by the parity check matrix given in (3). The extrinsic information may then be interleaved by interleaver 708, and generate LLR's $\{L_{O \rightarrow I}^q(y_i)\}_{i=1}^n$ for the next iteration.

After a sufficient number of iterations Q, outer decoder 704 computes $L_Q(x_i) = L_{I \rightarrow O}^{Q-1}(x_i) + L_{O \rightarrow I}^Q(x_i)$ as decoded information bits. Further, decision device 710 performs certain operations to generate original message bits 714 by $$\hat{x}_i = -\text{sign}[L_Q(x_i)] \text{ for } i=1, \ldots, k,$$

The original message bits 714, e.g., $\hat{x}_i$, are then provided to and further processed by information system 100. Decision device 710 may include any appropriate logic device, such as a software program, a hardware device, and/or a combination of both, that determines the original message bits based on the extrinsic information.

Figure 8:
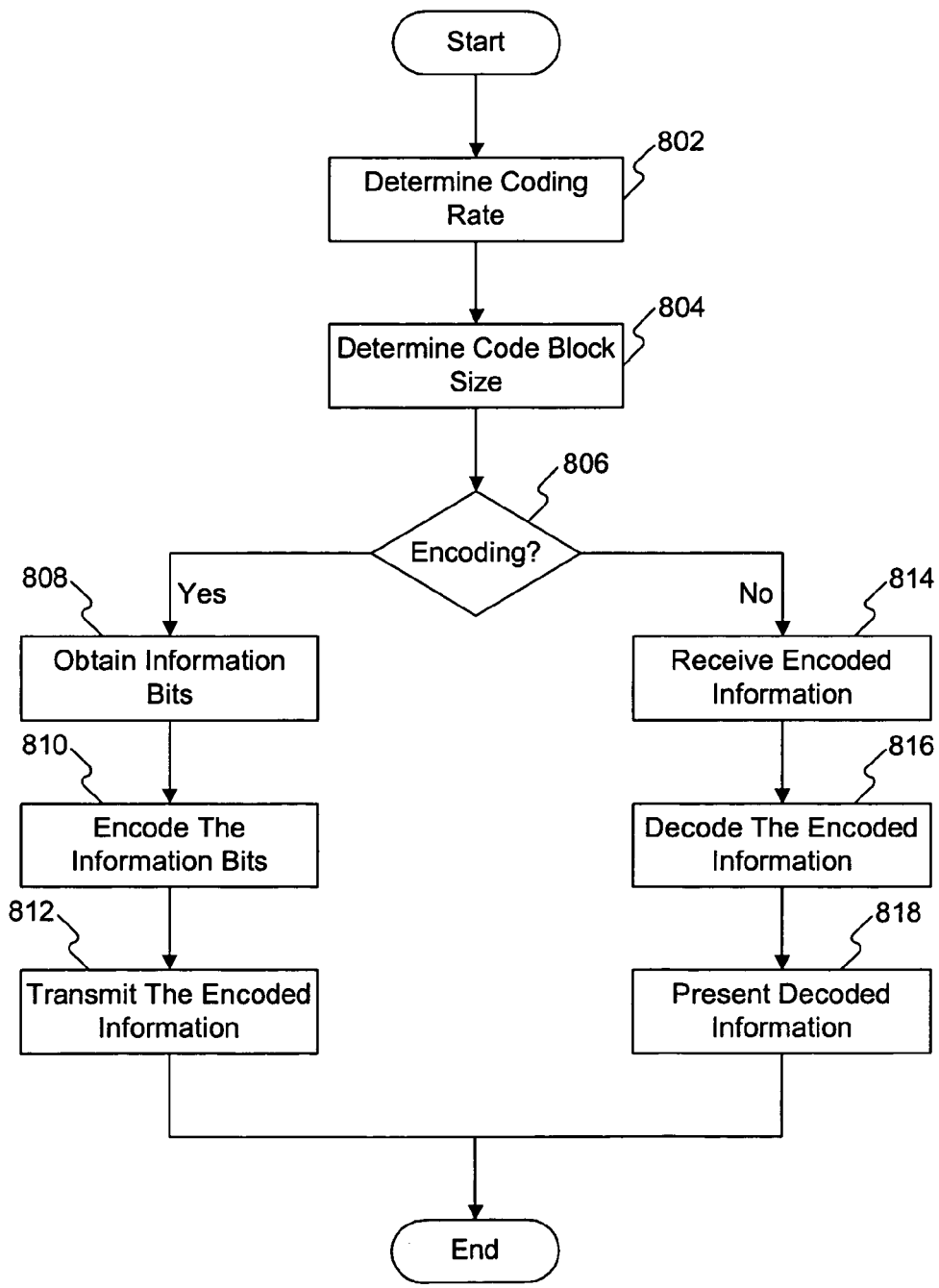
FIG. 8 illustrates an exemplary encoding and/or decoding process consistent with the present invention.

Processor 102 and/or communication interface 112 may use encoder 200 and decoder 700 to exchange messages with other communication systems. For example, processor 102 may execute certain software programs to perform certain processes for encoding and/or decoding purposes. FIG. 8 shows an exemplary encoding and/or decoding process.

Processor 102 determines a coding rate to be used for the encoding and/or decoding process (step 802). Processor 102 determines the coding rate based on whether to use a high rate code or a low rate code. Processor 102 may also determine the coding rate based on inputs or configurations from a user of information system 100 or based on exchanged information from other systems. In one embodiment, processor 102 determines a rate of ½ for low rate code and/or a rate of 32/33 for high rate code. Any number between ½ and 32/33, such as ¾, however, may be used for high rate code.

Processor 102 also determines code block size (n, k) to be used in the encoding and/or decoding process (step 804). Processor 102 may determine the code block size based on inputs or configurations from a user of information system 100 or based on exchanged information from other systems. In one embodiment, processor 102 determines the code block size as one of (n, k)=(1336, 1002), (5336, 4002), and (21336, 16002).

Further, processor 102 determines whether to perform an encoding process or a decoding process (step 806). If processor 102 determines to perform an encoding process (step 806; yes), processor 102 obtains the original messages to be encoded from a source of the messages, such as a hardware device or a software application (step 808). Processor 102 further provides the messages to encoder 200 to encode the messages (step 810). After the messages are encoded, processor 102 causes the encoded messages to be modulated and/or transmitted over communication channels (step 812).

On the other hand, if processor 102 determines to perform a decoding process (step 806; no), processor 102 obtains the received encoded information bits from a communication channel and de-modulates the information bits if they are modulated (step 814). Processor 102 further provides the encoded information bits to decoder 700 to decode the encoded information bits (step 816). After the information bits are decoded and original messages are recovered, processor 102 presents the messages or provides the messages to a user of information system 100 or to other systems or applications for further processing (step 818).

By applying a serial concatenation of a simplest (1+D) convolutional code and a rate-1 1/(1+D) accumulate code, the disclosed encoding and decoding methods and systems provide low encoding complexity, easy to implement, and low memory usage coding solutions with near capacity, i.e., near Shannon limit, the theoretical limit of maximum information transfer rate over a noisy channel, error rate performance. Such methods and systems may be used in various fields of communication, especially mobile communication. Such methods and systems may also to be used in other information processing systems, such as optical disk systems and storage systems, etc. Further, the disclosed encoding and decoding methods and systems may be used in combination of other coding systems and/or coding methods to improve overall performance of the other coding systems and/or coding methods.

It is intended that the specification and examples be considered as exemplary only. Other embodiments of the invention will be apparent to those skilled in the art from consideration of the specification and practice of the invention disclosed herein.

What is claimed is:

1. An encoder for use in information processing applications, comprising:
    an input configured to provide information bits to be encoded;
    a feedforward convolutional outer code encoder configured to encode the information bits to generate encoded information bits including the information bits and parity bits, wherein the feedforward convolutional outer code encoder includes a plurality of branch encoders and a plurality of branch interleavers coupled to the plurality of branch encoders;
    at least one interleaver configured to interleave the encoded information bits to generate an outer codeword; and
    a rate-1 1/(1+D) accumulate code based inner code encoder configured to encode the outer codeword to generate one or more codewords corresponding to the information bits.

2. The encoder according to claim 1, further including:
    an output configured to provide the codewords for modulation and transmission.

3. The encoder according to claim 1, wherein:
    provided that m and r are integers and the information bits have a length of mr, and i is an integer, the plurality of branch encoders include
    m number of branch encoders represented by $g_i(D)=1+D$ for i=0, . . . ,m−1 for generating the parity bits with a length of r.

4. The encoder according to claim 3, wherein:
    each branch encoder is respectively coupled to one of the plurality of branch interleavers such that output parity bits from each branch encoder are interleaved by the respectively coupled branch interleaver.

5. The encoder according to claim 3, wherein a first one of the branch encoders, $g_0(D)$, is not coupled to an interleaver to interleave the output from the first branch encoder.

6. The encoder according to claim 1, wherein:
    provided that m and r are integers and the information bits have a length of r, and i is an integer, the plurality of branch encoders include
    m number of branch encoders represented by $g_i(D)=1+D$ for i=0, . . . ,m−1 for generating the parity bits with a length of mr.

7. The encoder according to claim 6, wherein:
    each branch encoder is respectively coupled through one of the plurality of branch interleavers to the input such that the information bits from the input are interleaved by the one of the plurality of branch interleavers before being encoded by each branch encoder.

8. The encoder according to claim 6, wherein a first one of the branch encoders, $g_0(D)$, is not coupled to an interleaver and the first branch encoder receives the information bits from the input un-interleaved.

9. A decoder for use in information processing applications, comprising:
    an input configured to provide received information to be decoded;
    an inner decoder configured to decode inner codewords encoded by a rate-1 1/(1+D) accumulate code based inner code encoder to generate a log-likelihood ratio;
    an outer decoder configured to decode outer codewords encoded by a feedforward convolutional outer code encoder to generate extrinsic information, wherein the feedforward convolutional outer code encoder includes a plurality of branch encoders and a plurality of branch interleavers coupled to the plurality of branch encoders to generate information bits and parity bit, and an encoder interleaver coupled with the inner code encoder to generate the outer codewords;
    an interleaver configured to interleave the extrinsic information from the outer decoder to the inner decoder; and
    a de-interleaver configured to de-interleave the log-likelihood ratio from the inner decoder to the outer decoder.

10. The decoder according to claim 9, further including:
    a decision device configured to determine original message bits based on the extrinsic information and to generate a decoded message after a predetermined number of iterations between the outer decoder and the inner decoder.

11. The decoder according to claim 10, further including:
    an output configured to provide the decoded message to other applications.

12. A method for encoding information bits in information processing applications, comprising:
    obtaining the information bits to be encoded;
    encoding the information bits using a feedforward convolutional outer code encoder to generate encoded information bits including the information bits and parity bits, wherein the feedforward convolutional outer code encoder includes a plurality of branch encoders and a plurality of branch interleavers coupled to the plurality of branch encoders;
    interleaving the encoded information bits to generate an outer codeword by using at least one interleaver; and
    encoding the outer codeword by using a rate-1 1/(1+D) accumulate code based inner code encoder to generate one or more codewords corresponding to the information bits.

13. The method according to claim 12, wherein provided that m and r are integers and the information bits have a length of mr, and i is an integer, the encoding the information bits further includes:
    configuring the plurality of branch encoders of the outer encoder as m number of branch encoders represented by $g_i(D)=1+D$ for i=0, . . . ,m−1; and
    generating the parity bits with a length of r by using the m number of branch encoders.

14. The method according to claim 13, further including:
    coupling an interleaver from the plurality of branch interleavers between each branch encoder and the input such that the information bits from the input are interleaved by the interleaver before being encoded by each branch encoder.

15. The method according to claim 12, wherein provided that m and r are integers and the information bits have a length of r, and i is an integer, the encoding the information bits further includes:
    configuring the plurality of branch encoders of the outer encoder as m number of branch encoders represented by $g_i(D)=1+D$ for i=0, . . . ,m−1; and
    generating the parity bits with a length of mr by using the m number of branch encoders.

16. The method according to claim 15, further including:
    coupling an interleaver from the plurality of branch interleavers between each branch encoder and the input such that the information bits from the input are interleaved by the interleaver before being encoded by each branch encoder.

17. The method according to claim 12, further including:
    setting a code rate of a value between ½ and 32/33.

* * * * *